United States Patent
Kinoshita et al.

(10) Patent No.: US 8,271,254 B2
(45) Date of Patent: Sep. 18, 2012

(54) SIMULATION MODEL OF BT INSTABILITY OF TRANSISTOR

(75) Inventors: Akinari Kinoshita, Shiga (JP); Tomoyuki Ishizu, Kyoto (JP)

(73) Assignee: Panasonic Corporation, Osaka (JP)

( * ) Notice: Subject to any disclaimer, the term of this patent is extended or adjusted under 35 U.S.C. 154(b) by 1074 days.

(21) Appl. No.: 11/878,196

(22) Filed: Jul. 23, 2007

(65) Prior Publication Data

US 2008/0027700 A1    Jan. 31, 2008

(30) Foreign Application Priority Data

Jul. 28, 2006  (JP) ................................. 2006-206203
Jun. 26, 2007  (JP) ................................. 2007-167655

(51) Int. Cl.
    *G01R 31/34*     (2006.01)
    *G06F 7/60*     (2006.01)
    *G06F 17/50*     (2006.01)
    *G06F 9/44*     (2006.01)
    *G06F 9/445*     (2006.01)
    *G06G 7/54*     (2006.01)
    *G06G 7/52*     (2006.01)

(52) U.S. Cl. .......... 703/14; 324/765; 324/766; 324/769; 703/2; 703/13; 703/15; 703/16; 703/17; 703/18; 703/19; 703/20; 703/21; 716/1; 716/2; 716/4; 716/5; 716/9; 716/10

(58) Field of Classification Search .......... 703/2, 13–21; 324/765, 766, 769; 716/1, 2, 4, 5, 9, 10
See application file for complete search history.

(56) References Cited

U.S. PATENT DOCUMENTS

| | | | |
|---|---|---|---|
| 6,321,363 B1 * | 11/2001 | Huang et al. | 716/106 |
| 6,521,469 B1 * | 2/2003 | La Rosa et al. | 438/17 |
| 6,530,064 B1 * | 3/2003 | Vasanth et al. | 716/136 |
| 6,653,856 B1 * | 11/2003 | Liu | 324/750.03 |
| 6,731,179 B2 * | 5/2004 | Abadeer et al. | 331/57 |
| 6,795,802 B2 | 9/2004 | Yonezawa et al. | |
| 6,815,970 B2 * | 11/2004 | Rost et al. | 324/762.02 |
| 6,931,345 B1 * | 8/2005 | Kim et al. | 702/117 |
| 7,103,861 B2 * | 9/2006 | Ang et al. | 438/18 |
| 7,212,023 B2 * | 5/2007 | Krishnan et al. | 324/762.09 |
| 7,240,308 B2 * | 7/2007 | Usui | 716/136 |
| 7,268,575 B1 * | 9/2007 | Chen et al. | 324/762.09 |
| 7,366,648 B2 * | 4/2008 | Fujimori | 703/14 |
| 8,185,865 B2 * | 5/2012 | Gupta et al. | 716/139 |
| 2002/0022949 A1 * | 2/2002 | Yonezawa et al. | 703/14 |
| 2003/0055621 A1 * | 3/2003 | Wu et al. | 703/14 |
| 2003/0231028 A1 * | 12/2003 | Liu | 324/765 |
| 2003/0233624 A1 * | 12/2003 | Reddy et al. | 716/4 |
| 2004/0073412 A1 * | 4/2004 | Walker et al. | 703/2 |

(Continued)

OTHER PUBLICATIONS

Pregaldiny et al. "An advanced explicit surface potential model physically accounting for the quantization effects in deep-submicron MOSFETs", Solid-State Electronics 48 2004.*

(Continued)

*Primary Examiner* — Shambhavi Patel
(74) *Attorney, Agent, or Firm* — McDermott Will & Emery LLP

(57) ABSTRACT

A simulation model of BT instability of a transistor in a semiconductor integrated circuit, wherein a bias condition of at least one terminal among the drain terminal, the source terminal and the substrate terminal of the transistor is set up as an independent bias condition from other terminals; and then a model parameter of the transistor is changed in the set bias condition.

11 Claims, 7 Drawing Sheets

U.S. PATENT DOCUMENTS

| | | | | |
|---|---|---|---|---|
| 2005/0086033 | A1* | 4/2005 | Chen et al. | 703/2 |
| 2005/0138581 | A1* | 6/2005 | Usui | 716/4 |
| 2005/0278677 | A1* | 12/2005 | Ang et al. | 716/9 |
| 2006/0190859 | A1* | 8/2006 | Cui et al. | 716/4 |
| 2006/0261840 | A1* | 11/2006 | Hoon et al. | 324/769 |
| 2006/0282804 | A1* | 12/2006 | Ang et al. | 716/4 |

OTHER PUBLICATIONS

Enz et al. "An Analytical MOS Transistor Model Valid in All Regions of Operation and Dedicated to Low-Voltage and Low-Current Applications", Analog Integrated Circuits and Signal Processing, 8, 83-114 (1995).*

Bernstein et al. "Electronic circuit reliability modeling", Microelectronics Reliability (2006).*

Zhu, Baozhong. "Experimental Study of Bias Temperature Instability and Progressive Breakdown of Advanced Gate Dielectrics", 2005.*

Jha et al. "NBTI Degradation and Its Impact for Analog Circuit Reliability", IEEE Transactions on Electron Devices, Vol. 52, No. 12, Dec. 2005.*

Kristiansson et al. "A Surface Potential Model for Predicting Substrate Noise Coupling in Integrated Circuits", IEEE 2004 Custom Integrated Circuits Conference.*

Li, Wenmei. "Characterization of High-K Gate Stacks in Metal-Oxide-Semiconductor Capacitors.", 2001.*

Yu, Chuanzhao. "Study of Nanoscale CMOS Device and Circuit Reliability", 2006.*

Tian, Yang. "Selected Topics on Advanced Electron Devices and Their Circuit Applications", 2005.*

Yang et al. "On NBTI Degradation Process in Digital Logic Circuits", 20th International Conference on VLSI Design IEEE.*

Yu et al. "Impact of Temperature-Accelerated Voltage Stress on PMOS RF Performance", IEEE Transactions on Device and Materials Reliability, Vol. 4, No. 4, Dec. 2004.*

Li, Xiaojun. "Deep Submicron CMOS VLSI Circuit Reliability Modeling, Simulation, and Design", 2005.*

Reddy, V., et al., "Impact of Negative Bias Temperature Instability on Digital Circuit Reliability", Texas Instruments, 2002, pp. 248-252, IEEE.

Alam, M.A., "A Critical Examination of the Mechanics of Dynamic NBTI for PMOS FETs", Agere Systems, 2003, pp. 14.4.1-14.4.4, IEEE.

* cited by examiner (Substrate surface potential distribution)

(Surface potential approximated in a staircase pattern)

(Surface potential distribution)

(Surface potential distribution approximated to multistage)

(BT instability model application result)

SIMULATION MODEL OF BT INSTABILITY OF TRANSISTOR

BACKGROUND OF THE INVENTION

1. Field of the Invention

The present invention relates to a simulation model of a Bias Temperature (BT) instability of a field-effect transistor and a modeling method thereof. Furthermore, the present invention relates to a simulation device that uses the simulation model, and a semiconductor integrated circuit device designed through applying a simulation program that uses the simulation model.

2. Description of the Related Art

A reliability simulation in a design of a semiconductor integrated circuit is important as the means by which the semiconductor integrated circuit confirms, for example, the guarantee of proper operation for ten years (guarantee that the function can be maintained for ten years). As the factor of the time dependent instability that should be considered for a reliability assurance of a transistor, a BT instability, a hot-carrier deterioration, and a Time Dependent Dielectric Breakdown (TDDB) or the like are quoted. The BT indicates an applied bias and an operating temperature when the characteristic is deteriorated according to the applied bias condition and the temperature condition of a semiconductor device (chip).

In order to achieve a transistor that has a high electric current ability under lower power, it is important to achieve a thin film of a gate oxide film provided between the gate and silicon substrates of the transistor. In the improvement of the reliability of the semiconductor integrated circuit and the transistor, measures against rising of the threshold voltage and the decrease in the electric current ability that is generated due to the BT instability will be much more importance in the future. It is considered that the BT instability occurs as a result that the interface state and the fixed charge are generated since the Si to H (silicon-hydrogen) bond at interface between gate oxide film and silicon substrate of the transistor may break and the hydrogen atom penetrates into oxide film. However, everything of the physical phenomenon has not been clarified.

In a MOS transistor in the semiconductor integrated circuit, Negative Bias Temperature Instability (NBTI) and Positive Bias Temperature Instability (PBTI) are generated depending on the bias condition. Both of these instabilities degenerate the electrical characteristics of the transistor with time.

One of the models of the BT instability of a conventional transistor is set on the assumption that the surface potential distribution of the substrate under the gate becomes constant along a channel. This can be referred to in a non-patent document 1 (Vijay Reddy, et al., "Impact of Negative Bias Temperature Instability on Digital Circuit Reliability", Texas Instruments). For example, in an inverter circuit, the NBTI is examined under each bias condition of "gate terminal is −2.8V" and "drain terminal, source terminal, and substrate terminal are 0V" in a PMOS transistor group that configures the relevant inverter circuit. And then, the discussion in a circuit scale (circuit where at least one of the NMOS transistors and the PMOS transistors exist respectively) is performed by being applied the examination result of the PMOS transistor group to the aforementioned inverter circuit.

Moreover, other one of the models of the BT instability of the transistor is set on the assumption that the variation of the electrical characteristic of the transistor due to the BT instability is occurred because of a time dependent change in the electric charge near the interface between the substrate surface and the gate oxide film. Further, this model is set so that the concentration change of the electric charge on the substrate surface influences the threshold voltage directly. This can be referred to in a non-patent document 2 (M. A. Alam, "A Critical Examination of the Mechanics of Dynamic NBTI for PMOS FETs", Agere Systems).

The model of the BT instability of a conventional transistor described above is set in consideration of only the condition that the BT instability becomes largest (worst condition) based on assumption that the substrate surface potential (electrical potential) under the gate of the transistor is constant in the entire area on the substrate surface under the gate. More specifically, in the case of the modeling of the NBTI of the PMOS transistor, the model is created through giving the gate terminal a negative electrical potential, and setting up the drain terminal, the source terminal and the substrate terminal as 0V together, and then the simulation model is set by fixing the gate terminal to 0V and giving a positive same electrical potential to the drain terminal, the source terminal and the substrate terminal. In the model setting, it is assumed that it becomes a condition in which the BT instability occurs most easily in the entire area of the oxide film under the gate when the above-mentioned electrode bias of the terminal is given.

However, in an actual transistor operation on the semiconductor integrated circuit, for example, in the transistor in the circuit that performs analog operation, it is not likely that the drain terminal, the source terminal and the substrate terminal always operate at same electrical potential like the transistor in the inverter circuit. Furthermore, when the electrode bias of the drain terminal, the source terminal and the substrate terminal are mutually different, the potential of the substrate surface under the gate does not actually become constant in the entire area on the substrate surface under the gate. Therefore, when the bias potential of the drain terminal, the source terminal and the substrate terminal is treated as the same electrical potential, it becomes impossible to estimate the amount of the transistor of the electrical characteristic deterioration with high accuracy. The reason is explained below.

For example, in designing an operable semiconductor integrated circuit even after ten years, there is a case that the circuit operating after ten years is simulated by applying the shift of the threshold voltage and the decrease in the electric current ability estimated by the terminal bias, at which a BT instability becomes the worst case, to the semiconductor integrated circuit. In this case, it becomes a circuit operating simulation result that reflects a variation quantity that is bigger than the one where an actual semiconductor integrated circuit varies for ten years (Excess deterioration determination). And then, there is an advantage that an operable semiconductor integrated circuit after ten years will be actually fabricated if the semiconductor integrated circuit is designed based on the simulation result of such an excess deterioration determination. However, there is a problem that it becomes an excessive quality design that the semiconductor integrated circuit that has an excessive design allowance that exceeded the design allowance of the circuit necessary for operating after ten years aiming, for example, an operable semiconductor integrated circuit after 50 years is fabricated. Moreover, there is a problem that it causes the area growing more than the necessity.

SUMMARY OF THE INVENTION

Therefore, the main object of the present invention is to achieve the simulation at a proper level by which an excess evaluation and an excessive quality are not caused.

(1) A simulation model of BT instability of a transistor according to the present invention is a simulation model of the Bias Temperature (BT) instability of at least one transistor in the semiconductor integrated circuit. The simulation model sets up a bias condition of at least one terminal of the drain terminal, the source terminal and the substrate terminal of the transistor as an independent bias condition from other terminals, and then changes a model parameter of the simulation model of the transistor like BSIM (transistor simulation model developed by U. C. Berkeley) in order to generate an electrical characteristic variation of the transistor due to the BT instability on the simulation in the set bias condition.

There are the following parameters as the changing model parameter:

VTH0 that is a model parameter of the transistor of the BSIM when a threshold voltage of the simulation model of the transistor is made to vary;

U0 that is a model parameter of the transistor of mobility such as the BSIM when an electric current ability of the transistor is changed; and VSAT that is a model parameter of the transistor that indicates a saturation velocity of a career in a channel.

A simulation device of the present invention that uses a design of the semiconductor integrated circuit corresponding to the above-mentioned simulation model of the BT instability of the transistor relates to a reliability simulation that considers the time dependent degradation, and is a simulation device to which the simulation model of the BT instability, that generates the electrical characteristic variation of the transistor due to the BT instability in the set bias condition after setting up at least one terminal of the drain terminal, the source terminal and the substrate terminal of the transistor as the independent bias condition from other terminals, is embedded.

Moreover, a semiconductor integrated circuit device according to the present invention corresponding to the above-mentioned simulation device is a semiconductor integrated circuit device designed by using the simulation model of the BT instability that performs the reliability simulation that considers the time dependent degradation by using the simulation device, and generates the electrical characteristic variation of the transistor due to the BT instability in the set the bias condition after setting up at least one terminal of the drain terminal, the source terminal and the substrate terminal of the transistor as the independent bias condition from other terminals.

According to the simulation model of the BT instability in the present invention, since the BT instability is modeled in consideration of the bias dependence of each terminal of the transistor, even if each terminal bias value of the transistor varies according to the real circuit operation, each terminal bias dependence can be reflected to the amount of the BT instability of each transistor. Herewith, a conventional excessive design allowance becomes unnecessary. That is, treatment or the like that makes the distribution of the surface potential under the gate constant along the channel become unnecessary by giving a same electrical potential to all of the drain terminal, the source terminal and the substrate terminal in the reliability design of the semiconductor integrated circuit. As a result, it is possible to set up an accurate design allowance.

For example, as shown in FIG. 1, in the PMOS transistor, the distribution of the surface potential under the gate varies along the channel according to the difference of each terminal bias and becomes not constant when it is $V_G=-3V$, $V_D=-3V$, $V_S=0V$ and $V_B=0V$. The amount of charge that comes off in the gate oxide film also becomes different at each x coordinate because the distribution of surface potential under the gate is different along the channel.

(2) In the present invention, in a method for preparing the simulation model of the BT instability of the transistor, at least one model parameter obtained by relating a surface potential under a gate of the transistor to plural terminal biases is defined, and then each terminal bias condition is adjusted through the relevant model parameter so as to transform a distribution of a surface potential under a gate of the transistor smoothly along a channel.

Moreover, in the simulation device of the above-mentioned (1), there is an embodiment that the aforementioned simulation device is a simulation device to which the simulation model of the BT instability, wherein at least one model parameter obtained by relating a surface potential to the terminal biases is defined, and then, each terminal bias condition is adjusted through the relevant model parameter so as to change a distribution of a surface potential under a gate of the transistor smoothly along a channel, is embedded.

Moreover, in the semiconductor integrated circuit device of the above-mentioned (1), there is an embodiment that the aforementioned semiconductor integrated circuit device is a semiconductor integrated circuit device designed by using the simulation model of the BT instability, wherein at least one model parameter obtained by relating a surface potential to the terminal biases is defined, and then, each terminal bias condition is adjusted through the relevant model parameter so as to change a distribution of a surface potential under a gate of the transistor smoothly along a channel.

According to these embodiments, in operating the surface potential based on the terminal bias, it is possible to perform the operation responding to flexibly various conditions and set up more accurate design allowance in the reliability design of the semiconductor integrated circuit, by using the model parameter mentioned above.

(3) In the simulation modeling method of the BT instability of the transistor of the above-mentioned (2), there is an embodiment that the terminal bias condition is set so that a shape of a distribution of the surface potential under the gate of the transistor is approached to a multistage form.

Moreover, in the simulation device of the above-mentioned (1), there is an embodiment that the aforementioned simulation device is a simulation device to which the simulation model of the BT instability obtained by setting the terminal bias condition so that a shape of a distribution of the surface potential under the gate of the transistor is approached to a multistage form, is embedded.

Moreover, in the semiconductor integrated circuit device of the above-mentioned (1), there is an embodiment that the aforementioned semiconductor integrated circuit device is a semiconductor integrated circuit device designed by using the simulation model of the BT instability obtained by setting the terminal bias condition so that a shape of a distribution of the surface potential under the gate of the transistor is approached to a multistage form.

According to these embodiments, it becomes easy to handle the simulation model that has the terminal bias dependence as the present invention by using the simulation model that has the shape of the distribution is approximate to the multistage type.

(4) In the simulation modeling method of the BT instability of the transistor of the above-mentioned (3), there is an embodiment that the shape of the distribution of the surface potential under the gate of the transistor is made approximate to two-stage form by dividing the distribution of the surface potential under the gate of the transistor into two areas along the channel.

Moreover, in the simulation device of the above-mentioned (1), there is an embodiment that the aforementioned simulation device is a simulation device to which the simulation model of the BT instability, wherein the shape of the distribution of the surface potential under the gate of the transistor is made approximate to two-stage form by dividing the distribution of the surface potential under the gate of the transistor into two areas along the channel, is embedded.

Moreover, in the semiconductor integrated circuit device of the above-mentioned (1), there is an embodiment that the aforementioned semiconductor integrated circuit device is a semiconductor integrated circuit device designed by using the simulation model of the BT instability wherein the shape of the distribution of the surface potential under the gate of the transistor is made approximate to two-stage form by dividing the distribution of the surface potential under the gate of the transistor into two areas along the channel.

(5) In the simulation modeling method of the BT instability of the transistor of the above-mentioned (3), there is an embodiment that the shape of the distribution of the surface potential under the gate of the transistor is made approximate to the multistage form of three or more stages by dividing the distribution of the surface potential under the gate of the transistor into three or more areas along the channel in order to reflect an influence of all the terminal biases.

Moreover, in the simulation device of the above-mentioned (1), there is an embodiment that the aforementioned simulation device is a simulation device to which the simulation model of the BT instability, wherein the shape of the distribution of the surface potential under the gate of the transistor is made approximate to the multistage type of three or more steps by dividing the distribution of the surface potential under the gate of the transistor into three or more areas along the channel in order to reflect an influence of all the terminal biases, is embedded.

Moreover, in the semiconductor integrated circuit device of the above-mentioned (1), there is an embodiment that the aforementioned semiconductor integrated circuit device is a semiconductor integrated circuit device designed by using the simulation model of the BT instability obtained by making the shape of the distribution of the surface potential under the gate of the transistor approximate to the multistage form of three or more stages by dividing the distribution of the surface potential under the gate of the transistor into three or more areas along the channel in order to reflect an influence of all the terminal biases.

The example of the multistage approximation procedure that divides the distribution of the surface potential under the gate smoothly changed along the channel into three areas is shown in FIG. 2. An area A1 is assumed to a predominant area of the bias between the gate and the source to the surface potential, an area A2 is assumed to a predominant area of the bias between the gate and the substrate to the surface potential, and an area A3 is assumed to a predominant area of the bias between the gate and the drain to the surface potential. In this case, the model, by which the complex and actual distribution of the surface potential under the gate changed smoothly can be treated as a surface potential value that is different approximately in the stair-case pattern, is achieved.

(6) In the simulation modeling method of the BT instability of the transistor of the above-mentioned (3), there is an embodiment that modeling is achieved by treating the distribution of the surface potential under the gate of the transistor in a smooth curve along the channel in order to reflect an influence of all the terminal biases.

Moreover, in the simulation device of the above-mentioned (1), there is a mode that the aforementioned simulation device is a simulation device to which the simulation model of the BT instability, that is modeled by treating the distribution of the surface potential under the gate of the transistor in a smooth curve along the channel in order to reflect an influence of all the terminal biases, is embedded.

Moreover, in the semiconductor integrated circuit device of the above-mentioned (1), there is an embodiment that the aforementioned semiconductor integrated circuit device is a semiconductor integrated circuit device designed by using the simulation model of the BT instability modeled by treating the distribution of the surface potential under the gate of the transistor in a smooth curve along the channel in order to reflect an influence of all the terminal biases.

(7) In the simulation modeling method of the BT instability of the transistor of the above-mentioned (3), (4), (5) and (6), there is an embodiment that a variation $\Delta P$ of the model parameter of the transistor is expressed as a function where the surface potential, the temperature and the time constituted with the bias value of at least three terminals among the terminals of the transistor are included as the factors.

Moreover, in the simulation devices of the above-mentioned (1), there is an embodiment that the aforementioned simulation device is a simulation device to which the simulation model of the BT instability, that a variation $\Delta P$ of the model parameter of the transistor is expressed as a function where the surface potential, the temperature and the time constituted with the bias value of at least three terminals among the terminals of the transistor are included as the factors, is embedded.

Moreover, in the semiconductor integrated circuit devices of the above-mentioned (1), there is an embodiment that the aforementioned semiconductor integrated circuit device is a semiconductor integrated circuit device designed by using the simulation model of the BT instability that a variation $\Delta P$ of the model parameter of the transistor is expressed as a function where the surface potential, the temperature and the time constituted with the bias value of at least three terminals among the four terminals of the transistor as total, are included as the factors.

(8) In the simulation modeling method of the BT instability of the transistor of the above-mentioned (7), there is an embodiment that the surface potential constituted with the drain terminal bias $V_D$, the source terminal bias $V_S$, the substrate terminal bias $V_B$, and the gate terminal bias $V_G$ is expressed by a function $f(V_D, V_S, V_B, V_G)$, and then the variation $\Delta P$ of the transistor is expressed by the following mathematical formula $$\Delta P = g(f(V_D, V_S, V_B, V_G), \text{Temp}, \text{time})$$

that is a function g that uses a function f, a temperature Temp and a time "time".

Moreover, in the simulation devices of the above-mentioned (1), there is an embodiment that the simulation model of the BT instability, where the surface potential constituted with the terminal bias $V_D$, the source terminal bias $V_S$, the substrate terminal bias $V_B$, and the gate terminal bias $V_G$, is expressed by a function $f(V_D, V_S, V_B, V_G)$, and then the variation $\Delta P$ of the model parameter of the transistor is expressed by the following mathematical formula $$\Delta P = g(f(V_D, V_S, V_B, V_G), \text{Temp}, \text{time})$$

that is a function g that uses a function f, a temperature Temp and a time "time", is embedded.

Moreover, in the semiconductor integrated circuit devices of the above-mentioned (1), there is an embodiment that the aforementioned semiconductor integrated circuit device is a semiconductor integrated circuit device designed by using the simulation model of the BT instability where the surface potential constituted with the drain terminal bias $V_D$, the source terminal bias $V_S$, the substrate terminal bias $V_B$, and the gate terminal bias $V_G$ is expressed by a function $f(V_D, V_S, V_B, V_G)$, and then the variation $\Delta P$ of the transistor is expressed by the following mathematical formula $$\Delta P = g(f(V_D, V_S, V_B, V_G), \text{Temp}, \text{time})$$

that is a function g that uses a function f, a temperature Temp and a time "time".

(9) In the simulation modeling method of the BT instability of the transistor of the above-mentioned (7), there is an embodiment that the surface potential constituted with the drain terminal bias $V_D$, the source terminal bias $V_S$, the substrate terminal bias $V_B$ and the gate terminal bias $V_G$ is expressed by a function $f(V_D, V_S, V_B, V_G)$, and then the variation $\Delta VTH0$ of the model parameter concerning the threshold value of the transistor when BSIM is used, for example, as the transistor model is expressed by the following mathematical formula $$\Delta VTH0 = g(f(V_D, V_S, V_B, V_G), \text{Temp}, \text{time})$$

that is a function g that uses a function f, a temperature Temp and a time "time".

Moreover, in the simulation devices of the above-mentioned (1), there is an embodiment that the aforementioned simulation device is a simulation device to which the simulation model of the BT instability, where the surface potential constituted with the drain terminal bias $V_D$, the source terminal bias $V_S$, the substrate terminal bias $V_B$, and the gate terminal bias $V_G$ is expressed by a function $f(V_D, V_S, V_B, V_G)$, and then the variation $\Delta VTH0$ of the model parameter concerning the threshold value of the transistor in using BSIM, for example, as the transistor model is expressed by the following mathematical formula $$\Delta VTH0 = g(f(V_D, V_S, V_B, V_G), \text{Temp}, \text{time})$$

that is a function g that uses a function f, a temperature Temp and a time "time", is embedded.

Moreover, in the semiconductor integrated circuit devices of the above-mentioned (1), there is an embodiment that the aforementioned semiconductor integrated circuit device is a semiconductor integrated circuit device designed by using the simulation model of the BT instability where the surface potential constituted with the drain terminal bias $V_D$, the source terminal bias $V_S$, the substrate terminal bias $V_B$, and the gate terminal bias $V_G$ is expressed by a function $f(V_D, V_S, V_B, V_G)$, and then the variation $\Delta VTH0$ of the model parameter concerning the threshold value of the transistor in using BSIM, for example, as the transistor model is expressed by the following mathematical formula $$\Delta VTH0 = g(f(V_D, V_S, V_B, V_G), \text{Temp}, \text{time})$$

that is a function g that uses a function f, a temperature Temp and a time "time".

(10) In the simulation modeling method of the BT instability of the transistor of the above-mentioned (7), there is an embodiment that the surface potential constituted with the drain terminal bias $V_D$, the source terminal bias $V_S$, the substrate terminal bias $V_B$, and the gate terminal bias $V_G$ is expressed by a function $f(V_D, V_S, V_B, V_G)$, and then the variation $\Delta VSAT$ of the model parameter concerning the electric current of the transistor in using BSIM, for example, as the transistor model is expressed by the following mathematical formula $$\Delta VSAT = g(f(V_D, V_S, V_B, V_G), \text{Temp}, \text{time})$$

that is a function g that uses a function f, and a temperature Temp and a time "time".

Moreover, in the simulation devices of the above-mentioned (1), there is an embodiment that the aforementioned simulation device is a simulation device to which the simulation model of the BT instability, where the surface potential constituted with the drain terminal bias $V_D$, the source terminal bias $V_S$, the substrate terminal bias $V_B$, and the gate terminal bias $V_G$ is expressed by a function $f(V_D, V_S, V_B, V_G)$, and then the variation $\Delta VSAT$ of the model parameter concerning the electric current of the transistor when BSIM is used for example as the transistor model is expressed by the following mathematical formula $$\Delta VSAT = g(f(V_D, V_S, V_B, V_G), \text{Temp}, \text{time})$$

that is a function g that uses a function f, and a temperature Temp and a time "time", is embedded.

Moreover, in the semiconductor integrated circuit devices of the above-mentioned (1), there is an embodiment that the aforementioned semiconductor integrated circuit device is a semiconductor integrated circuit device designed by using the simulation model of the BT instability where the surface potential constituted with the drain terminal bias $V_D$, the source terminal bias $V_S$, the substrate terminal bias $V_B$, and the gate terminal bias $V_G$ is expressed by a function $f(V_D, V_S, V_B, V_G)$, and then the variation $\Delta VSAT$ of the model parameter concerning the electric current of the transistor in using BSIM, for example, as the transistor model is expressed by the following mathematical formula $$\Delta VSAT = g(f(V_D, V_S, V_B, V_G), \text{Temp}, \text{time})$$

that is a function g that uses a function f, and a temperature Temp and a time "time".

(11) In the simulation modeling method of the BT instability of the transistor of the above-mentioned (7), there is an embodiment that the surface potential constituted with the drain terminal bias $V_D$, the source terminal bias $V_S$, the substrate terminal bias $V_B$, and the gate terminal bias $V_G$ is expressed by a function $f(V_D, V_S, V_B, V_G)$, and then the variation $\Delta U0$ of the model parameter concerning the mobility of the transistor in using BSIM, for example, as the transistor model is expressed by the following mathematical formula $$\Delta U0 = g(f(V_D, V_S, V_B, V_G), \text{Temp}, \text{time})$$

that is a function g that uses a function f, a temperature Temp and a time "time".

Moreover, in the simulation devices of the above-mentioned (1), there is an embodiment that the aforementioned simulation device is a simulation device to which the simulation model of the BT instability, that the surface potential constituted with the drain terminal bias $V_D$, the source terminal bias $V_S$, the substrate terminal bias $V_B$, and the gate terminal bias $V_G$ is expressed by a function $f(V_D, V_S, V_B, V_G)$, and then the variation $\Delta U0$ of the model parameter concerning the mobility of the transistor in using BSIM, for example, as the transistor model is expressed by the following mathematical formula $$\Delta U0 = g(f(V_D, V_S, V_B, V_G), \text{Temp}, \text{time})$$

that is a function g that uses a function f, a temperature Temp and a time "time".

Moreover, in the semiconductor integrated circuit devices of the above-mentioned (1), there is an embodiment that the aforementioned semiconductor integrated circuit device is a semiconductor integrated circuit device designed by using the simulation model of the BT instability where the surface potential constituted with the drain terminal bias $V_D$, the source terminal bias $V_S$, the substrate terminal bias $V_B$, and the gate terminal bias $V_G$ is expressed by a function $f(V_D, V_S, V_B, V_G)$, and then the variation $\Delta U0$ of the model parameter concerning the mobility of the transistor in using BSIM, for example as the transistor model is expressed by the following mathematical formula $$\Delta U0 = g(f(V_D, V_S, V_B, V_G), \text{Temp}, \text{time})$$

that is a function g that uses a function f, a temperature Temp and a time "time".

According to the present invention, since the BT instability is modeled by using the distribution of the surface potential under the gate in consideration of the terminal bias of the transistor, and the approximation with high accuracy is used, the appropriate design allowance required at minimum can be estimated, and it is effective to miniaturize the semiconductor integrated circuit.

The simulation model of the BT instability according to the present invention is useful as the technique for the reliability verification simulation of the semiconductor integrated circuit and creation of the reliability design allowance and the like. Moreover, the simulation model of the BT instability according to the present invention can be used also for a design environment constructed by simulating the semiconductor integrated circuit and the semiconductor integrated circuit device designed with the design environment.

Although the most preferable concrete example about this invention was explained in detail, the combination and the array of parts of the preferred embodiment can change variously without contradicting within the spirit and the range of this invention claimed later.

BRIEF DESCRIPTION OF THE DRAWINGS

If the embodiments, that will be explained hereinafter, is understood, other objects of the present invention out of this becomes clear, and is specified in the attached claims. And, if this invention is implemented, those skilled in the art conceive of a lot of profits that do not touch in this specification. In the Drawings:

DETAILED DESCRIPTION OF THE INVENTION

Figure 1:
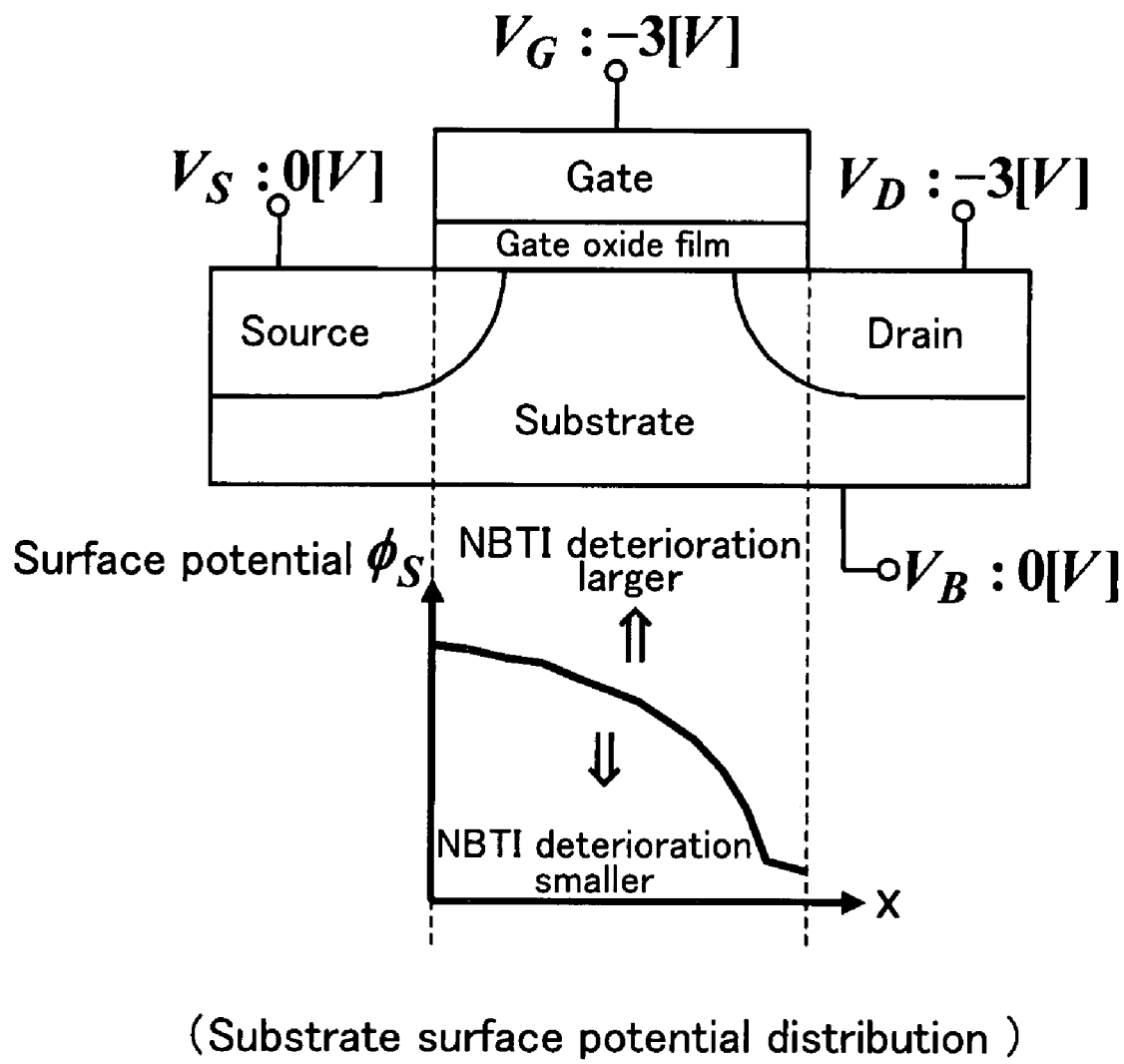
FIG. 1 is a schematic diagram of distribution of surface potential under a gate of a transistor in a modeling method of BT instability according to the present invention.
Figure 2:
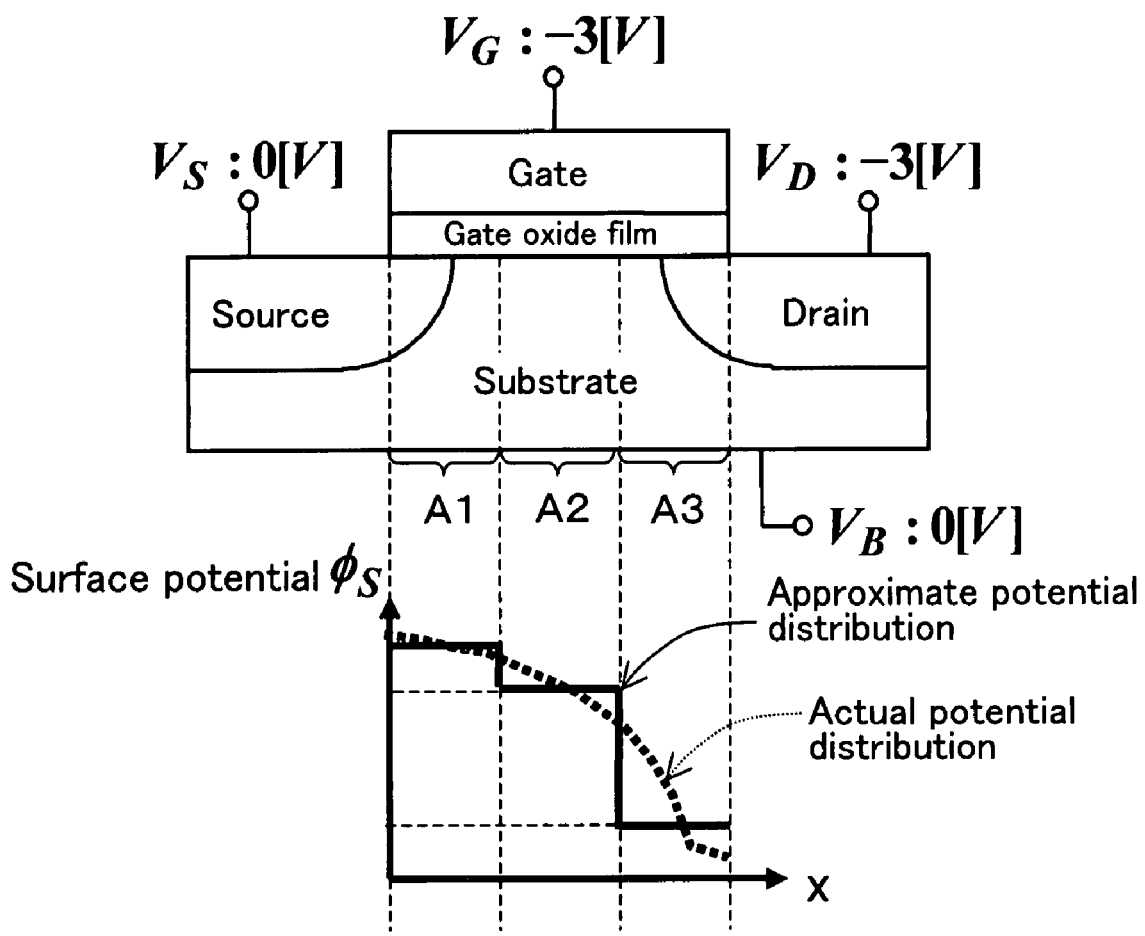
FIG. 2 is a schematic diagram of the surface potential approximated in the staircase pattern of three steps in the modeling method of the BT instability according to the present invention.
Figure 3:
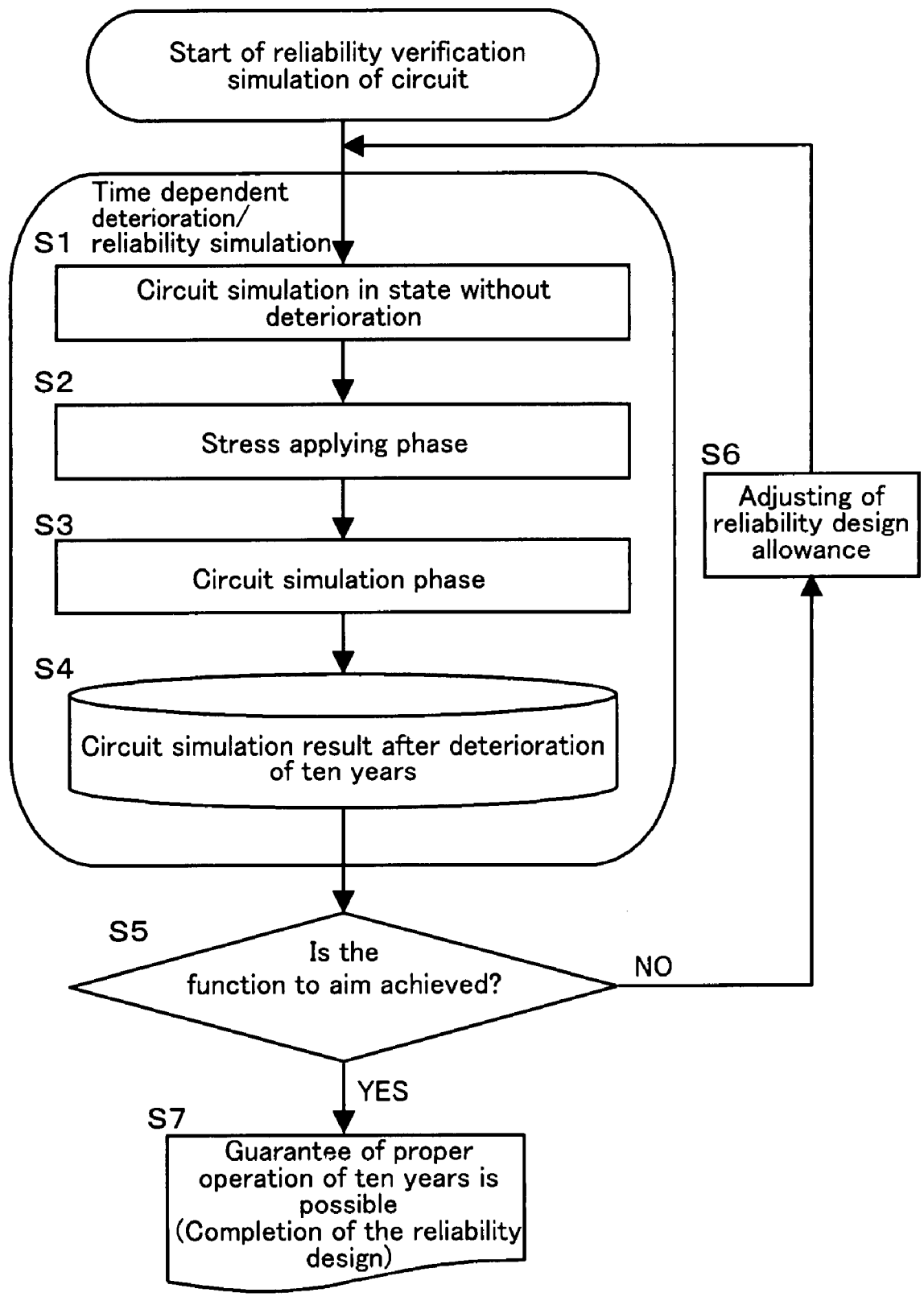
FIG. 3 is a design flow outline for a reliability verification and a design allowance creation of the modeling method of the BT instability of the transistor according to an embodiment of the present invention.

Hereinafter, the embodiment of the simulation model of the BT instability of the transistor, the simulation modeling method, the simulation device and the semiconductor integrated circuit device according to the present invention is explained in detail on the basis of the drawing. FIG. 3 is a schematic flow chart showing a process of the processing of reliability verification for a guarantee of a proper operation during ten years of a semiconductor integrated circuit in this embodiment.

The function of the simulation of reliability/time dependent degradation is included in some circuit simulators. Modeling has already been performed about the physical phenomenon that has a large influence on the threshold and the electric current ability of the transistor such as the BT instability and the hot carrier. These physical phenomenons are helped in setting up the design allowance concerning the reliability of the circuit.

The design that satisfies the age guarantee of proper operation of the semiconductor integrated circuit (for example, guarantee of proper operation for ten years) is a designing method for reproducing the transistor characteristic deteriorated after ten years by the simulation, and for verifying whether or not the semiconductor integrated circuit achieves the desired operating even under such the transistor characteristic. The design procedure is explained below.

The reliability verification simulation of the circuit is started, and then the circuit simulation in the state without deterioration is executed as the time dependent degradation/reliability simulation (S1). Next, a stress application phase is executed (S2). Herewith, the stress of the time, the temperature, and the terminal bias is given to the transistor on the simulation, and then the BT instability is generated. Next, a phase of the simulation to verify the circuit operating is executed (S3). As a result, for example, a circuit simulation result after deterioration of ten years is obtained (S4).

Next, the verification whether or not the intended function is achieved is executed (S5). As a result of the verification, the reliability design allowance is adjusted when it is determined not to satisfy the function (S6), and then it is executed repeatedly from the above-mentioned circuit simulation in the state without the deterioration. As for the above-mentioned adjusting, the transistor is replaced with the one with a larger channel width so as to expand the design allowance, or the like, for example, in order to improve the electric current ability of the transistor. When the intended function is obtained, the reliability design is completed as possible for an age guarantee of proper operation (S7).

The threshold voltage shift and the decrease in the electric current ability due to the BT instability are caused by the instability of Si to H (silicon to hydrogen) connection in an interface between gate oxide film and silicon substrate. Moreover, threshold voltage shift and the decrease in the electric current ability due to the BT instability are caused by the generation of the interface potential and the fixed charge when hydrogen is dissociated from Si to H coupling and diffuses due to influence of the electron that is leaked out from the gate to the substrate.

In this embodiment, the concept that the BT instability changes through combining the drain terminal bias, the source terminal bias and the substrate terminal bias is added to the above-mentioned concept.

The variation of the terminal bias is reflected in distribution of surface potential under the gate. Through changing the surface potential along the channel consecutively, it is considered that there are an easy part for generating along the channel and a difficult part for generating along the channel exist with respect to the generating part of the BT instability.

In order to model this easily, at least one model parameter is added, and then the terminal bias and the surface potential are linked.

$$\begin{cases} \phi_{s1} = f_1(\alpha, V_G, V_S) \\ \phi_{s2} = f_2(\beta, V_G, V_B) \\ \phi_{s3} = f_3(\gamma, V_G, V_D) \end{cases} \quad (14)$$

In the above equation (14), $\Phi_s$ is the surface potential, $\alpha$, $\beta$, and $\gamma$ are the model parameters to link the terminal bias and the surface potential, $V_G$ is the gate terminal bias, $V_D$ is the drain terminal bias, $V_S$ is the source terminal bias and $V_B$ is the substrate terminal bias. For example, $\Phi_{S1}$ is the surface potential at a position P1 in the direction of the edge of the source under the gate in location P1 in FIG. 4, $\Phi_{S2}$ is the surface potential at a position P2 in the direction of the center under the gate in location P2 in FIG. 4, and $\Phi_{S3}$ is the surface potential at a position P3 in the direction of the edge of the drain under the gate in FIG. 4. Following equation (15) or the like are considered as the simplest concrete example.

$$\begin{cases} \phi_{s1} = \alpha(V_S - V_G) \\ \phi_{s2} = \beta(V_B - V_G) \\ \phi_{s3} = \gamma(V_D - V_G) \end{cases} \quad (15)$$

Similarly, treating the surface potential by dividing the distribution of the surface potential under the gate of the transistor into three areas and expressing each potential value with the more complex function, the model equation of surface potential like following equation (16) is considered if it is considered that each surface potential are affected by all the terminal biases.

$$\begin{cases} \phi_{s1} = a_1(V_D - V_G) + a_2(V_S - V_G) + a_3(V_B - V_G) + a_4 \\ \phi_{s2} = b_1(V_D - V_G) + b_2(V_S - V_G) + b_3(V_B - V_G) + b_4 \\ \phi_{s3} = c_1(V_D - V_G) + c_2(V_S - V_G) + c_3(V_B - V_G) + c_4 \end{cases} \quad (16)$$

Figure 4:
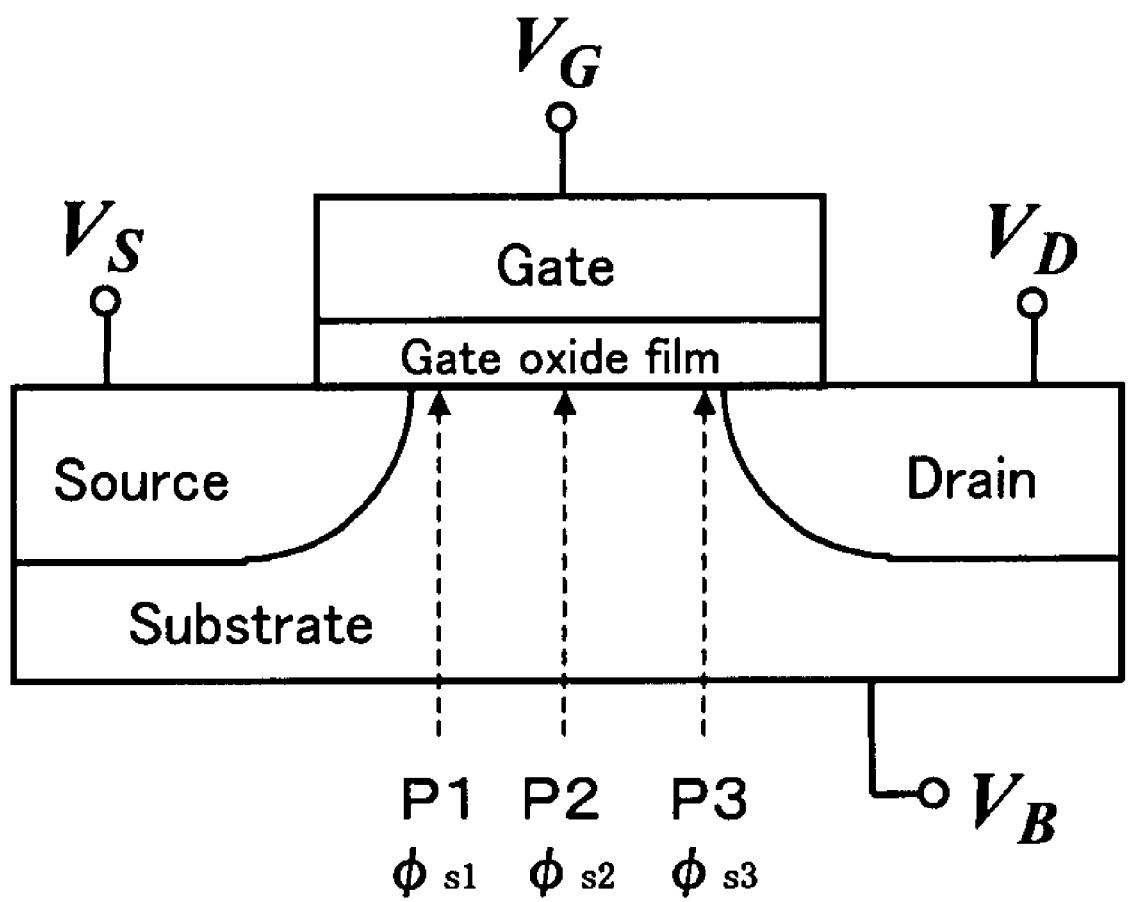
FIG. 4 is outline explanatory drawing of an equation (14) according to the embodiment of the present invention.

$a_1$ is a coefficient parameter that shows the degree of incidence of the bias between the drain and gate terminals of the surface potential $\Phi_{s1}$ in FIG. 4, $a_2$ is a coefficient parameter concerning the bias between the source and gate terminals similarly, $a_3$ is a coefficient parameter concerning the bias between the substrate and the gate terminal, and $a_4$ is a constant term parameter that does not depend on the terminal bias in the surface potential $\Phi_{s1}$. Similarly, $b_1$, $b_2$, $b_3$ and $b_4$ are model parameters concerning the surface potential $\Phi_{s2}$, and $c_1$, $c_2$, $c_3$ and $c_4$ are model parameters concerning the surface potential $\Phi_{s3}$.

Figure 5:
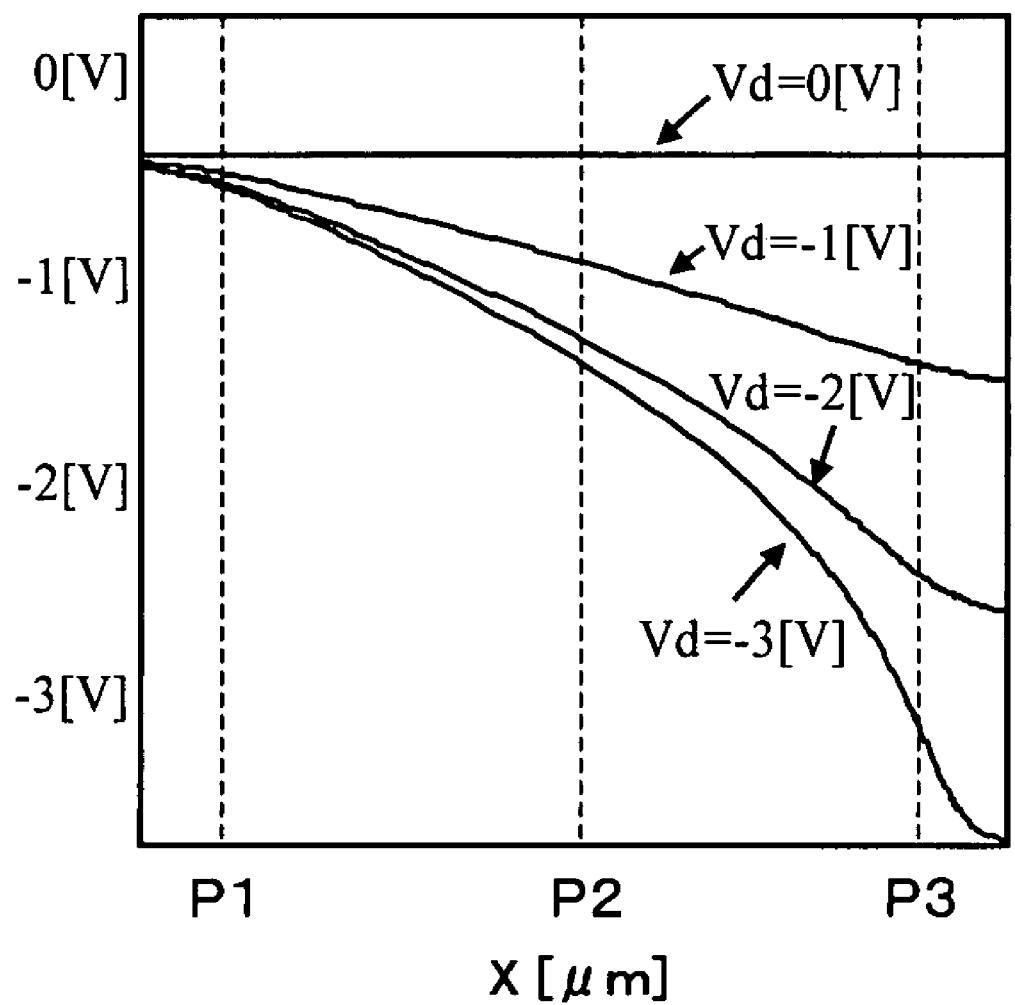
FIG. 5 is a distribution map of surface potential under the gate by using a device simulator according to the embodiment of the present invention.

Next, the appearance where the surface potential changes smoothly along the channel is shown in FIG. 5. Distribution of the surface potential under the gate changes variously due to the terminal bias condition. It changes intricately when a variety of the source terminal biases and the substrate terminal biases are given.

Figure 6:
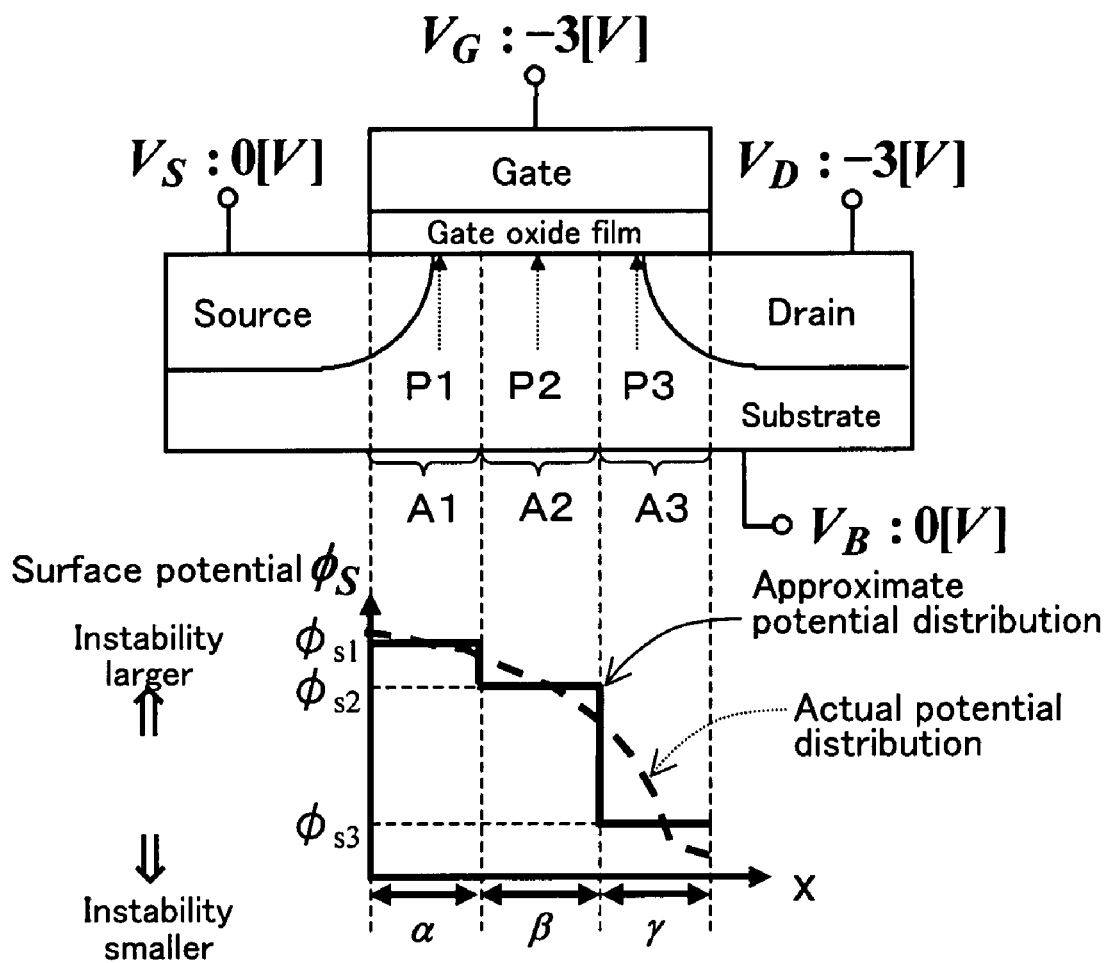
FIG. 6 is a distribution map of surface potential under the gate approximated to the multistage of three steps according to the embodiment of the present invention.

As a method for handling the complex distribution easily through modeling the distribution of the surface potential under the gate changed intricately and smoothly, for example, there is a method for modeling the distribution of the surface potential under the gate of the transistor so as to become the approximate form in the staircase pattern of three steps as shown in FIG. 6.

This modeling method is explained below.

In this method:

All the surface potential values in area A1 are fixed to the surface potential value in location P1;

All the surface potential values in area A2 are fixed to the surface potential value in location P2; and All the surface potential values in area A3 are fixed to the surface potential value in location P3.

And then:

Area A1 is considered to be an area where the bias between the source and the gate in the area most influences the surface potential;

Area A2 is considered to be an area where the bias between the substrate and the gate in the area most influences the surface potential; and Area A3 is considered to be an area where the bias between the drain and the gate in the area most influences the surface potential.

Here, the area A1, A2 and A3 don't need to be defined at equal intervals. For example, when modeling the transistor created in the process where the drain terminal dependency is strong, the weighting between the areas reflected with the value of $\alpha$, $\beta$, and $\gamma$ of equation (14) can be implemented by performing processing of enlarging the value of $\gamma$ in a equation (14) etc.

An example of the model of the model parameter shift of the transistor due to the BT instability in the prior art is shown in following equation (17).

$$\Delta P = b \cdot \exp(c \cdot V_{GS}) \cdot \exp\left(-\frac{E_a}{k \cdot TEMP}\right) \cdot time^n \quad (17)$$

Here, $\Delta P$ is a shift amount of the transistor model parameter, b and c are the coefficient parameters, $V_G$ is the gate bias, Ea is activation energy, k is a Boltzman's constant, Temp is a temperature, "time" is time, and n is a model parameter of the time-dependency.

When each of the terminal bias dependence of the present invention is added to the conventional model described above and is modeled, following equation (18) is derived.

$$\Delta P = b \cdot \exp(c \cdot f(\alpha, \beta, \gamma, V_D, V_S, V_B, V_G)) \cdot \exp\left(-\frac{E_a}{k \cdot TEMP}\right) \cdot time^n \quad (18)$$

In the equation (18), $f(\alpha, \beta, \gamma, V_D, V_S, V_B, V_G)$ is a surface potential function approximated in a staircase pattern or a surface potential function treated on average, etc. This equation (18) becomes mathematical model that gives the shift amount of the model parameter of the transistor.

For example, when the threshold voltage is shifted in a configuration that uses BSIM as a transistor, in the model of the BT instability of conventional, there is a model where the model equation has been treated as following equation (19).

$$\Delta VTH0 = \qquad (19)$$
$$b \cdot \exp(c \cdot f(\alpha, \beta, \gamma, V_D, V_S, V_B, V_G)) \cdot \exp\left(-\frac{E_a}{k \cdot TEMP}\right) \cdot time^n$$

According to the present invention, this model is treated as a model equation of the BT instability in following equation (20).

$$\Delta VTH0 = b \cdot \exp(c \cdot f(\alpha, \beta, \gamma, V_D, V_S, V_B, V_G)) \cdot \exp\left(-\frac{E_a}{k \cdot TEMP}\right) \cdot time^n \quad (20)$$

For example, when the transistor electric current is shifted in a configuration that uses BSIM as a transistor, in the model of the BT instability in the prior art, there is a model that the model equation has been treated as following equation (21).

$$\Delta VSAT = b \cdot \exp(c \cdot V_{GS}) \cdot \exp\left(-\frac{E_a}{k \cdot TEMP}\right) \cdot time^n \quad (21)$$

According to the present invention, this model is treated as a model equation of the BT instability in following equation (22).

$$\Delta VSAT = b \cdot \exp(c \cdot f(\alpha, \beta, \gamma, V_D, V_S, V_B, V_G)) \cdot \exp\left(-\frac{E_a}{k \cdot TEMP}\right) \cdot time^n \quad (22)$$

For example, when mobility is shifted in a configuration that uses BSIM as a transistor, in the model of the BT instability in the prior art, there is a model that has been treated as following equation (23).

$$\Delta U0 = b \cdot \exp(c \cdot V_{GS}) \cdot \exp\left(-\frac{E_a}{k \cdot TEMP}\right) \cdot time^n \quad (23)$$

According to the present invention, this model equation is treated as a model equation of the BT instability in following equation (24).

$$\Delta U0 = b \cdot \exp(c \cdot f(\alpha, \beta, \gamma, V_D, V_S, V_B, V_G)) \cdot \exp\left(-\frac{E_a}{k \cdot TEMP}\right) \cdot time^n \quad (24)$$

Figure 7:
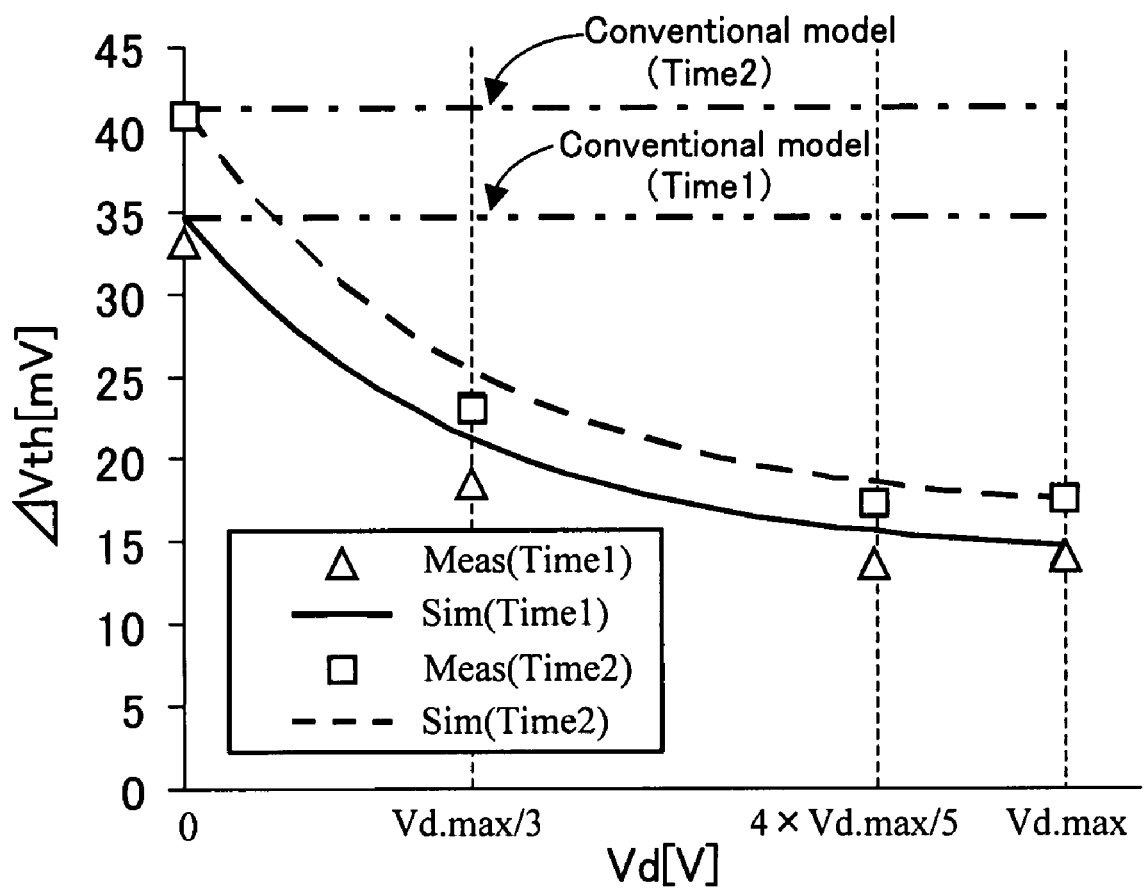
FIG. 7 is a result chart obtained by applying BT degradation model created in the embodiment of the present invention.

The drain terminal bias dependence of the threshold value shift based on the BT instability model having the terminal bias dependence created by the modeling method of the BT instability according to this embodiment is shown in FIG. 7. FIG. 7 is an application example of the model of the NBTI applied to the PMOS transistor. The axis of abscissas |Vd| is an absolute value of the drain terminal bias, the axis of ordinates |ΔVth| is an absolute value of the shift amount of the threshold voltage, Time1 and Time2 are the arbitrary time separately defined, Meas is an actual measurement value, and Sim is a simulation result by the model created according to this embodiment. As shown in FIG. 7, it is understood that the model created by the modeling method of the BT instability according to the present invention is a model by which the actual measurement value of BT instability in a variety of drain terminal biases can be simulated with high accuracy.

After calculating ΔVTH0 after elapsed time length where it is desired to execute the reliability verification (for example, ΔVTH0 after ten years lapse) by using the above-mentioned model, the calculated ΔVTH0 is added to the model parameter VTH0 of the transistor concerning the threshold voltage of BSIM that is a standard transistor model. Herewith, the model parameter of the transistor having the threshold voltage after ten years lapse is obtained. If the model parameter of this transistor is used, the reliability verification simulation of the semiconductor integrated circuit can be implemented.

Although the most preferable concrete example about this invention was explained in detail, the combination and the array of parts of the preferred embodiment can change variously without contradicting the spirit and the range of this invention claimed later.

What is claimed is:

1. A simulation modeling method of BT instability of a transistor in a semiconductor integrated circuit, comprising:
   setting a bias condition of at least one terminal among the drain terminal, the source terminal and the substrate terminal of a simulated model of the transistor as an independent bias condition from other terminals of the simulated model; and
   calculating BT instability based on simulating the model with a model parameter of the transistor model changed and being operated under the set bias condition;
   wherein after defining at least one model parameter obtained by relating a surface potential under the gate of the transistor and at least one terminal bias among the drain terminal, the source terminal and the substrate terminal of the transistor, each of the terminal bias conditions is adjusted through the aforementioned model parameter so as to calculate BT instability using a function considered a distribution of a surface potential under a gate of the transistor.

2. The simulation modeling method of BT instability according to claim 1, wherein
   the model parameter is a threshold value of the transistor.

3. The simulation modeling method of BT instability according to claim 1, wherein
   the model parameter is a current value of the transistor.

4. The simulation modeling method of BT instability according to claim 1, wherein
   the model parameter is mobility.

5. The simulation modeling method of BT instability according to claim 1, wherein
   said model parameter is expressed as a function where the bias value, a temperature and time of at least three terminals among the drain terminal, the source terminal, the substrate terminal and a gate terminal included in the transistor, are taken as a factor.

6. The simulation modeling method of BT instability according to claim 1, wherein
   a variation ΔP of the model parameter of the transistor is expressed by the following mathematical formula $\Delta P = g(f(V_D, V_S, V_B, V_G), \text{Temp}, \text{time})$ that consists of a function $f(V_D, V_S, V_B, V_G)$ by a drain terminal bias $V_D$, a source terminal bias $V_S$, a substrate terminal bias $V_B$, and a gate terminal bias $V_G$, and a function g that uses a temperature Temp and a time time.

7. A simulation device programmed to perform the simulation modeling method according to claim 1.

8. A semiconductor integrated circuit device including a transistor designed by using a program which performs the simulation modeling method according to claim 1.

9. The simulation modeling method according to claim 1, wherein
   each of the terminal bias conditions is set so that a shape of a distribution of the surface potential under the gate of the transistor is approximated to a multistage form.

10. The simulation modeling method according to claim 1, wherein
the shape of the distribution of the surface potential under the gate of the transistor is approximated to two-stage shape by dividing the distribution of the surface potential under the gate of the transistor into two areas along the channel.

11. The simulation modeling method according to claim 1, wherein
the shape of the distribution of the surface potential under the gate of the transistor is approximated to the multi-stage form of three or more stages by dividing the distribution of the surface potential under the gate of the transistor into three or more areas along the channel in order to reflect an influence of all the terminal biases.

* * * * *